(12) United States Patent
Nogi

(10) Patent No.: US 6,734,746 B1
(45) Date of Patent: May 11, 2004

(54) MUTE CIRCUIT

(75) Inventor: Akihiko Nogi, Atsugi (JP)

(73) Assignee: Asahi Kasei Microsystems Co., Ltd., Tokyo (JP)

(*) Notice: Subject to any disclaimer, the term of this patent is extended or adjusted under 35 U.S.C. 154(b) by 0 days.

(21) Appl. No.: 10/334,908

(22) Filed: Jan. 2, 2003

(51) Int. Cl.[7] .............. H03B 9/02; H03F 1/02; H03F 1/14; H03F 3/45
(52) U.S. Cl. ............... 331/81; 330/9; 330/51; 330/69
(58) Field of Search ............... 331/81; 330/9, 330/51, 69

(56) References Cited

U.S. PATENT DOCUMENTS

| | | | |
|---|---|---|---|
| 5,764,103 A | * | 6/1998 | Burra et al. ............... 330/51 |
| 6,111,965 A | * | 8/2000 | Lubbe et al. ............... 381/94.5 |
| 6,114,981 A | * | 9/2000 | Nagata ............... 341/143 |

* cited by examiner

Primary Examiner—Patricia Nguyen
(74) Attorney, Agent, or Firm—Finnegan, Henderson, Farabow, Garrett & Dunner, L.L.P.

(57) ABSTRACT

To provide a mute circuit capable of reducing or eliminating noises generated in accordance with an offset voltage under a mute operation. The present invention comprises a summing amplifier, switch, and mute signal generating circuit.

6 Claims, 4 Drawing Sheets

MUTE CIRCUIT

BACKGROUND OF THE INVENTION

1. Field of the Invention

The present invention relates to a mute circuit for outputting or not outputting an input analog signal according to necessity.

2. Description of the Related Art

It is necessary to smoothly vary outputs of the mute circuit to reduce click noises from occurring when mute mode are changed.

The circuit shown in FIG. 1 has been already known as the above type of the circuit.

As shown in FIG. 1, the mute circuit comprises an inverting circuit 2 including an operational amplifier 1, resistor R11 and R12, a capacitor, and a switch 1 connecting the output of the inverting circuit 2 and ground. An analog signal is supplied to the inverting input terminal of the operational amplifier 1 through the capacitor and the resistor 11, and a mute signal is directly input to the non-inverting input terminal.

In the mute circuit, it is known that a mode of shutdown or reducing power consumption (hereafter referred to as power-down mode), the power-down mode is canceled and power is supplied according to necessity. Operations of the power-down mode are described below.

Under the power-down mode, the operational amplifier 1 is not operated and the switch SW1 closes to fix the output of the operational amplifier 1 to the earth.

When the power-down mode is canceled, the operational amplifier 1 is ready for operations and the switch SW1 opens. Then, a mute signal rises from 0 (V) up to an analog common voltage. Therefore, the operational amplifier 1 outputs a voltage in which an inverting analog input signal is added to the analog common voltage.

In general, the operational amplifier 1 has an offset voltage of several mV to tens of mV. Therefore, when the switch SW1 is opened, and the mode changes from or to the power-down mode, the output of the operational amplifier 1 shifts by the offset voltage and occurs noises.

It is possible to lower or eliminate the offset voltage by increasing the size of a MOS transistor which constitutes the operational amplifier or adding a calibration circuit. However, a disadvantage occurs that the chip size of the operational amplifier 1 is increased.

Moreover, in a conventional circuit, mute signals of 0 (V) to analog common voltage Vc are input to the inverting input terminal of an operational amplifier. Therefore, an operational amplifier needs an input range of 0 (V) to Vc.

Therefore, a mute circuit has been requested which can reduce or eliminate noises generated due to an offset voltage under a mute operation.

It is an object of the present invention to provide a mute circuit in which no click sound is generated even if a power source is turned off.

SUMMARY OF THE INVENTION

The present invention a summing amplifier for an inverting analog input signal and a mute signal, the summing amplifier for outputting sum of the inverted input signal and mute signal; a switch for connecting the output of the summing amplifier to the ground voltage; and a mute signal generating circuit capable of stepping down the output of said summing amplifier to the ground voltage; wherein the mute signal generating circuit generates a predetermined voltage for canceling the offset voltage generated by the summing amplifier.

As an aspect of the present invention, the above summing amplifier comprises a first operational amplifier having an inverting input terminal, a non-inverting input terminal, and an output terminal; a first resistor connected to the inverting input terminal of the first operational amplifier to supply the analog input signal; a second resistor connected to the inverting input terminal of the first operational amplifier to supply the mute signal; and a feedback resistor connected between the inverting input terminal and the output terminal of the first operational amplifier, the non-inverting input terminal of the first operational amplifier being supplied the analog common voltage.

As another aspect of the present invention, a capacitive element is connected between a terminal for inputting the analog signal and the first resistor.

As still another aspect of the present invention, the mute signal generating circuit further comprises a selecting circuit for selecting either of the analog common voltage and the ground voltage, the selected voltage being supplied to the mute signal generating circuit; a comparing circuit for comparing the level of the mute signal generated by the mute signal generating circuit with a reference level; and a control circuit for controlling the selecting circuit based on the output of the comparing circuit.

As still another aspect of the present invention, the mute signal generating circuit comprises; a second operational amplifier having an inverting input terminal, a non-inverting input terminal, and an output terminal; a third resistor connected to the inverting input terminal of the second operational amplifier to supply the analog common voltage or the ground voltage selected by the selecting circuit; and a feedback resistor connected between the inverting input terminal and the output terminal of the second operational amplifier, the non-inverting input terminal of the second operational amplifier being supplied the analog common voltage; and the mute signal generating circuit generates a mute signal for canceling the offset voltage of the first operational amplifier.

As still another aspect of the present invention, the selecting circuit comprises a first switch for connecting the output terminal of the selecting circuit to an analog common voltage via a first resistor, a second switch for connecting the output terminal of the selecting circuit to the ground voltage via a second resistor, and a capacitor connected to the output terminal of the selecting circuit; and outputs of the output terminal are varied with the time constant of the first and second resistors and capacitors.

As described above, the present invention includes a summing amplifier, a switch, and a mute signal generating circuit.

Therefore, the present invention is possible to reduce or eliminate noises generated due to the offset voltage generated by a summing amplifier under a mute operation.

DETAILED DESCRIPTION OF THE PREFERRED EMBODIMENTS

Figure 2:
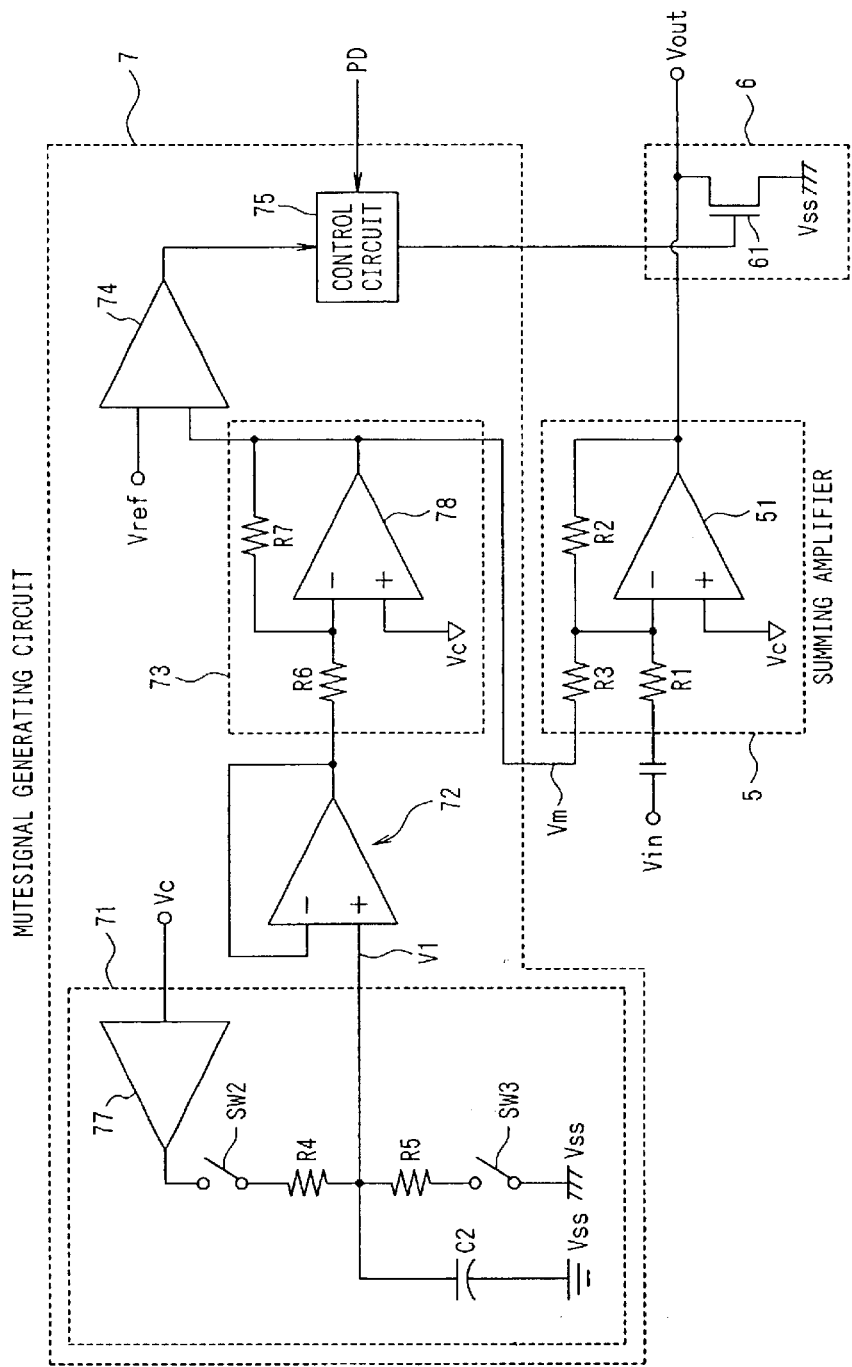
FIG. 2 is a block diagram showing a configuration of an embodiment of the present invention.

FIG. 2 is a circuit diagram showing an embodiment of a mute circuit of the present invention.

As shown in FIG. 2, the mute circuit comprises a summing amplifier 5 for an inverting analog input voltage Vin and a mute voltage Vm at a predetermined gain, and summing these inverted voltages, a switch 6 connecting an output of the summing amplifier 5 to the ground voltage Vss, and a mute signal generating circuit 7 for generating the mute voltage Vm.

The summing amplifier 5 includes an operational amplifier 51 and resistors R1 to R3. That is, the analog input voltage Vin is input to the inverting input terminal of the operational amplifier 51 via a capacitor and the resistor R1, and the mute voltage Vm generated by the mute signal generating circuit 7 is also input to the inverting input terminal via the resistor R3.

An analog common voltage Vc is applied to the non-inverting input terminal of the operational amplifier 51. The feedback resistor R2 is connected between the inverting input terminal and output terminal of the operational amplifier 51. Moreover, an output voltage Vout can be supplied from the output terminal of the operational amplifier 51.

The switch 6 is constituted by an N-type MOS transistor 61 also as to be turned on/off in accordance with a control voltage supplied from a control circuit 75. Moreover, the source of the MOS transistor 61 is connected to the ground voltage Vss (0 V) and the drain of it is connected to the output terminal of the operational amplifier 51.

The mute circuit further comprises a voltage generating circuit 71 for generating a mute voltage, a buffer circuit (voltage follower circuit) 72, an inverting amplifier 73, a comparator 74, and a control circuit 75. The inverting amplifier 73 operates as the mute signal generating circuit.

The voltage generating circuit 71 selects the analog common voltage Vc or ground voltage Vss in accordance with selection of a switch SW2 or SW3, and generates voltages to be varied from the ground voltage Vss to the analog common voltage Vc or the analog common voltage Vc to the ground voltage Vss.

More minutely, the voltage generating circuit 71 is comprising a buffer amplifier 77, a capacitor C2, resistors R4 and R5, and switches SW2 and SW3.

The analog common voltage Vc is supplied to the input of the buffer amplifier 77. The output terminal of the buffer amplifier 77 is connected to the switch SW2 and the other end of the switch SW2 is connected to the ground voltage Vss via the resistors R4 and R5 and the switch SW3.

An output voltage V1 is the voltage of the node between the resistors R4 and R5, and supplied to the buffer circuit 72. The node between the resistors R4 and R5 is connected to the ground voltage Vss via the capacitor C2. The buffer circuit 72 comprises the operational amplifier connecting with the inverting input terminal and output terminal of the operational amplifier.

The inverting amplifier 73 inverts the output voltage of the buffer circuit 72 at a predetermined gain and outputs to the summing amplifier 5 and the comparator 74 as a mute voltage Vm. The inverting amplifier 73 is comprising an operational amplifier 78 and resistors R6 and R7.

More minutely, the inverting input terminal of the operational amplifier 78 is connected with the output terminal of the buffer circuit 72 via the resistor R6. The analog common voltage Vc is applied to the non-inverting input terminal of the operational amplifier 78. The resistor R7 is connected between the inverting input terminal and output terminal of the operational amplifier 78. Moreover, the output terminal of the operational amplifier 78 is connected to the resistor R3 of the summing amplifier 5 and moreover connected to the input terminal of the comparator 74.

The comparator 74 compares the mute voltage Vm with the reference voltage vref (e.g. 2.5 V) and outputs the comparison result to the control circuit 75.

The control circuit 75 controls the turn-on/off control of the MOS transistor 61 and the switches SW2 and SW3 according to the output from the comparator 74 and a power down signal PD from the outside. The switch SW2 is controlled by the inverted signal of the control signal of the switch SW3.

Figure 3:
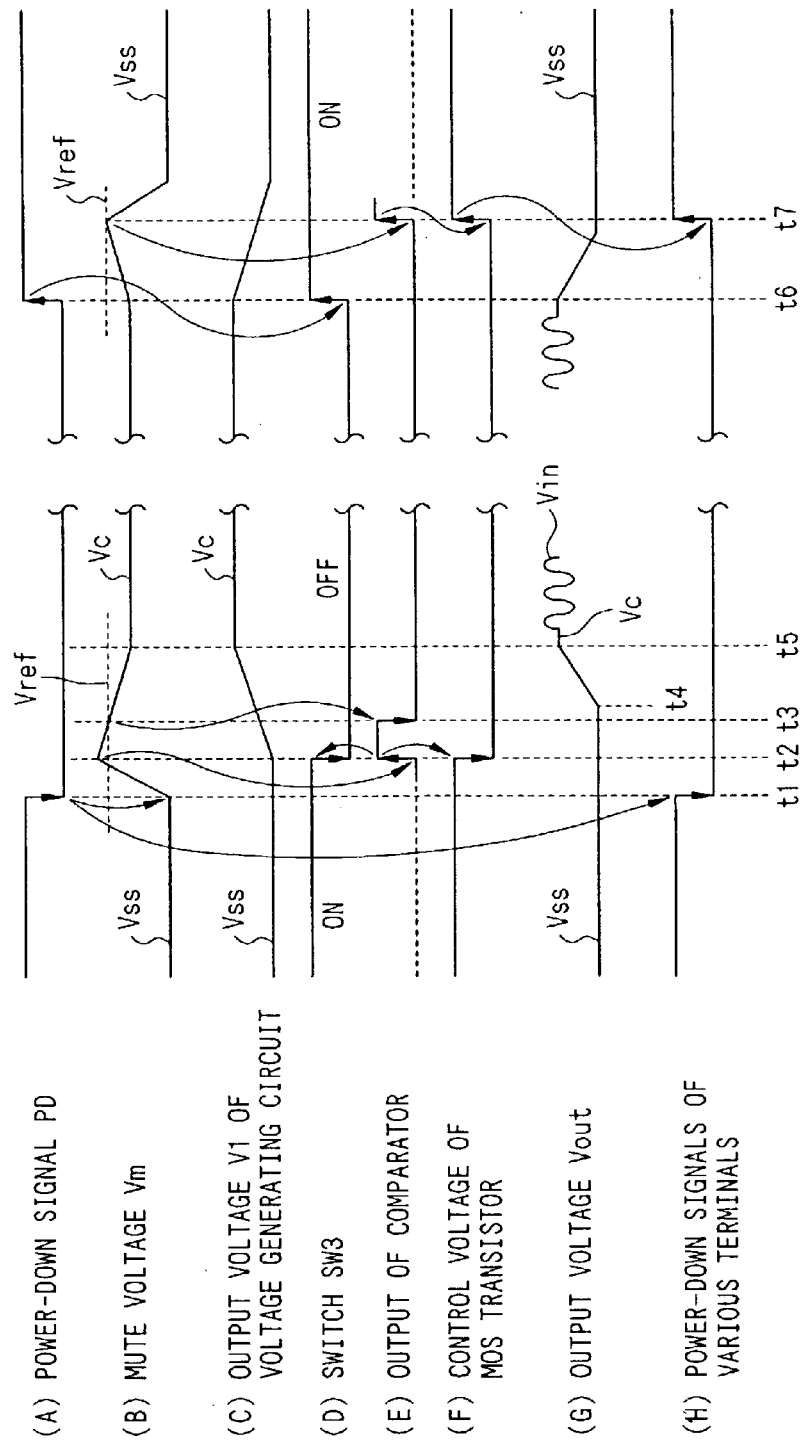
FIG. 3 is an illustration showing waveforms of various terminals of an embodiment of the present invention.

The above embodiment operates as below by referring to FIGS. 2 and 3.

As shown in FIG. 3(A), a power-down signal PD supplied to the control circuit 75 is kept "H"-level before time t1. In this period, the power-down signal for controlling power supply to various sections is also kept "H"-level as shown in FIG. 3(H). Power to the voltage generating circuit 71, buffer circuit 72, inverting amplifier 73, comparator 74, and summing amplifier 5 is not supplied while the power-down mode is set and various sections do not operate.

Therefore, the mute voltage Vm to the summing amplifier 5 is equal to the ground voltage Vss (0 V) as shown in FIG. 3(B) and the output voltage of the comparator 74 is unstable as shown in FIG. 3(E). The control voltage of the MOS transistor 61 from the control circuit 75 is kept "H"-level as shown in FIG. 3(F) and the MOS transistor 61 is turned on. The output voltage Vout of the summing amplifier 5 is the ground voltage Vss as shown in FIG. 3(G).

Thereafter, when the power-down signal PD falls at time t1 as shown in FIG. 3(A), the power-down signal for controlling power supply to various sections falls as shown in FIG. 3(H) and the power-down mode is cancelled. Thereby, power is supplied to the voltage generating circuit 71, buffer circuit 72, inverting amplifier 73, comparator 74, and summing amplifier 5 and the power-up state is set.

In this period, the switch SW2 is kept open (turning-off) and the switch SW3 is kept close (turning-on) (refer to FIG. 3(D)), and the output of the buffer circuit 72 is the ground voltage Vss. Therefore, the mute voltage Vm which is the output of the inverting amplifier 73 suddenly rises from the ground voltage Vss as shown in FIG. 3(B) up to the voltage shown by the following expression (1).

$$Vm = (1 + R7/R6)Vc \qquad (1)$$

The output voltage Vout of the summing amplifier 5 becomes the level of ground voltage Vss (0 V). The inverting amplifier 73 generates a mute voltage Vm' satisfying the following expression (2) in order to cancel the offset voltage Voff generated by the summing amplifier 5.

$$Vm' = (1 + R3/R2)(Vc + Voff) \qquad (2)$$

It is necessary to decide the resistance ratio between R2, R3, R6, and R7 so that $Vm \geq Vm'$ is satisfied.

In this time, the summing amplifier 5 is powered up and noises are generated. However, the noises do not appear on the output voltage Vout because the control voltage of the MOS transistor 61 from the control circuit 75 is kept "H"-level and the MOS transistor 61 is turned on as shown in FIG. 3(F).

The comparator 74 compares the mute voltage Vm with the reference voltage Vref. The reference voltage Vref is equal to the voltage Vm' that the output voltage Vout of the summing amplifier 5 is fixed into the ground voltage Vss (0 V) and that the offset voltage Voff generated by the summing amplifier 5 is canceled.

As shown in FIG. 3(B), when the mute voltage Vm becomes higher than the reference voltage Vref (2.5 V) at time t2, the output voltage of the comparator 74 rises from "L"-level up to "H"-level as shown in FIG. 3(E).

After the output voltage of the comparator 74 rises, the control voltage of the MOS transistor 61 changes from "H"-level to "L"-level as shown in FIG. 3(F) and the MOS transistor 61 is turned off. In this time, because the output voltage Vout of the summing amplifier 5 is kept at the level of the ground voltage Vss, no noise is output.

At the same time, the switch SW3 is turned off (refer to FIG. 3(D)) and the switch SW2 is turned on at time t2 and the output voltage of the buffer amplifier 77 starts charging the capacitor C2 through the resistor R4.

By charging the capacitor C2, the output voltage V1 of the voltage generating circuit 71 slowly rises from the ground voltage Vss with a time constant depending on the resistor R4 and capacitor C2 as shown in FIG. 3(C). The mute voltage Vm from the inverting amplifier 73 slowly lowers as shown in FIG. 3(B).

At time t3, the mute voltage Vm becomes lower than the reference voltage Vref as shown in FIG. 3(B), the output of the comparator 74 falls from "H"-level to "L"-level as shown in FIG. 3(E).

At time t4, the output voltage Vout of the summing amplifier 5 starts rising from the ground voltage Vss as shown in FIG. 3(G). Time t4 is delayed from start of fall of the mute voltage Vm because the mute voltage Vm supplied to the summing amplifier 5 satisfied with the expression (1) and absorbs (cancels) the offset voltage generated by the summing amplifier 5.

At time t5, the output voltage V1 of the voltage generating circuit 71 rises up to the analog common voltage Vc as shown in FIG. 3(C), the mute voltage Vm supplied from the inverting amplifier 73 falls to the analog common voltage Vc as shown in FIG. 3(B), and the output voltage Vout of the summing amplifier 5 rises up to the analog common voltage Vc as shown in FIG. 3(G). Thereafter, an analog signal Vin is input to the summing amplifier 5.

The output voltage Vout of the summing amplifier 5 becomes a voltage in which the analog input signal Vin is added to the analog common voltage Vc as shown in FIG. 3(G).

At time t6, the power-down signal PD rises from "L"-level to "H"-level as shown in FIG. 3(A), the control circuit 75 turns on the switch SW3(refer to FIG. 3(D)) and simultaneously turns off the switch SW2.

The output voltage V1 of the voltage generating circuit 71 starts falling from the analog common voltage Vc toward the ground voltage Vss as shown in FIG. 3(C). The mute voltage Vm supplied from the inverting amplifier 73 starts rising from the analog common voltage Vc as shown in FIG. 3(B) and the output voltage Vout of the summing amplifier 5 falls toward the ground voltage Vss as shown in FIG. 3(G).

The mute signal generating circuit 7 generates the mute voltage Vm shown by the expression (1), as described above.

At time t7, the mute voltage Vm rises up to the reference voltage Vref, the output of the comparator 74 rises from "L"-level to "H"-level as shown in FIG. 3(E). As a result, the control voltage of the MOS transistor 61 from the control circuit 75 rises from "L"-level to "H"-level as shown in FIG. 3(F).

In this time, the output voltage Vout of the summing amplifier 5 is kept at the ground voltage Vss as shown in FIG. 3(G), no noise appears on the output voltage Vout even if the control voltage of the MOS transistor 61 changes. The MOS transistor 61 is turned on due to the change of the control voltage and the output terminal of the summing amplifier 5 is fixed to the ground voltage Vss by the MOS transistor 61.

In rising of the control voltage of the MOS transistor 61, the power-down signal for controlling power supply to various sections changes from "L"-level to "H"-level as shown in FIG. 3(H). Power supply to the voltage generating circuit 71, buffer circuit 72, inverting amplifier 73, comparator 74, and summing amplifier 5 is stopped and these circuits are powered down and operations of various sections are stopped.

Thus, when the summing amplifier 5 is powered down, noises are generated, however, the noises do not appear on the output signal Vout because the output terminal of the summing amplifier 5 is fixed to the ground voltage Vss by the MOS transistor 61.

Figure 1:
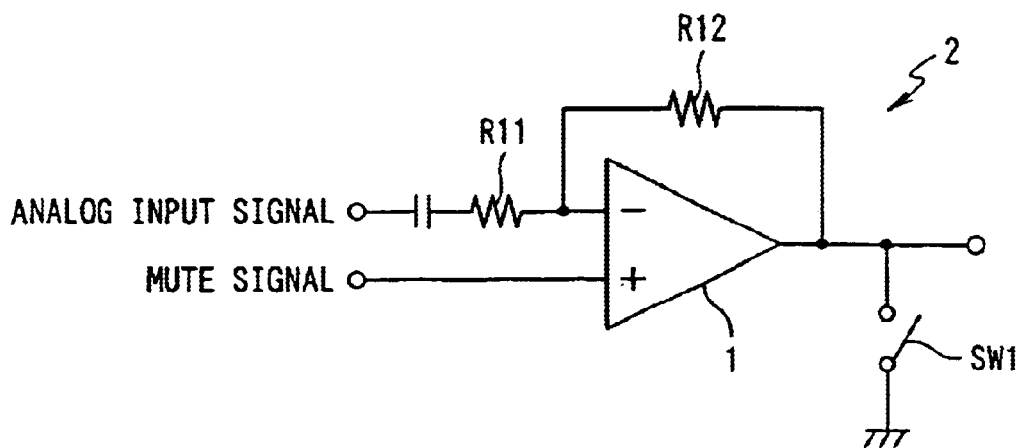
FIG. 1 is a block diagram showing a configuration of a conventional circuit.

In the conventional mute circuit shown in FIG. 1, it may not be possible to adjust the offset voltage of the operational amplifier 1 by adjusting a mute signal.

In the case of the operational amplifier 1 has a positive offset voltage, the output of the operational amplifier 1 rises by the value equivalent to the positive offset voltage even if setting a mute signal to 0 (V).

In this embodiment, the mute signal generating circuit 7 cancels the offset voltage of the summing amplifier 5 and fixes the output voltage Vout to the ground voltage Vss in the mute operation.

Method of obtaining the mute voltage is described below by referring to FIG. 4.

Figure 4:
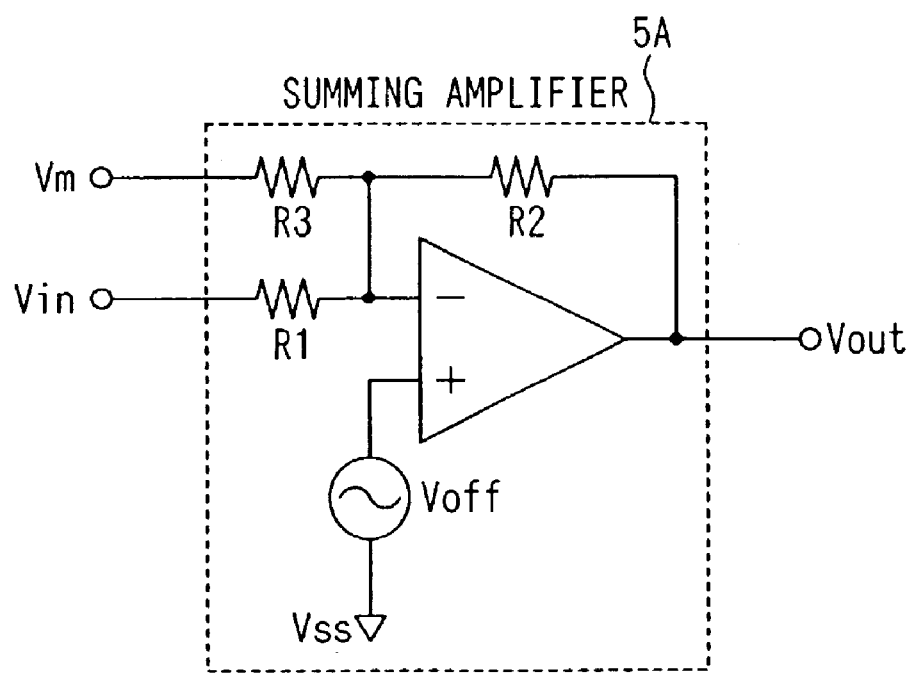
FIG. 4 is an illustration for explaining how to decide a mute voltage.

FIG. 4 shows a summing amplifier 5A which corresponds to the summing amplifier 5 shown in FIG. 2 but is different from the summing amplifier 5 in that the ground voltage Vss (0 V) is supplied to the non-inverting input terminal of the operational amplifier 51.

The output voltage Vout of the summing amplifier 5A in FIG. 4 is shown by the following expression (3) when assuming an analog input voltage as Vin, a mute voltage as Vm, and an offset voltage converted into the input as Voff.

$$Vout = -(R2/R1)Vin - (R2/R3)Vm + Voff(1 + (R2/R1) + (R2/R3)) \quad (3)$$

The output voltage Vout of the summing amplifier 5A becomes the ground voltage Vss (0 V) under a mute operation.

Under a mute operation solving the expression (3) about the mute voltage Vm, the following expression (4) is obtained.

$$Vm = -(R3/R1)Vin + Voff((R3/R2) + (R3/R1) + 1) \quad (4)$$

By supplying the voltage shown by the expression (4) to the summing amplifier 5A as the mute voltage Vm in mute operation, it is possible to convert the output voltage Vout of the summing amplifier 5A into the ground voltage (0 V) with the offset voltage absorbed (cancelled).

In the case of this embodiment, the mute voltage Vm according to the expression (4) is necessary. In the case of the summing amplifier 5 in FIG. 2, the analog common voltage Vc is supplied to the non-inverting terminal of the operational amplifier 51 and analog input voltage Vin is input through a capacitor. Therefore, the mute voltage Vm to be supplied to the summing amplifier 5 under a mute operation is shown by the expression (2).

As described above, this embodiment includes the summing amplifier 5, switch 6, and mute signal generating circuit 7.

Therefore, it is possible to reduce or eliminate noises generated in accordance with the offset voltage generated by the summing amplifier 5 in mute operation.

Because this embodiment uses the summing amplifier 5, the operating point of the summing amplifier 5 is decided by the voltage of the non-inverting input terminal of the operational amplifier 51. Therefore, it is enough that an input range corresponds only to an analog common voltage.

According to the present invention, it is possible to reduce or eliminate noises generated in accordance with the offset voltage generated by a summing amplifier in mute operation.

We claim:

1. A mute circuit comprising:
   a summing amplifier for an inverting analog input signal and a mute signal, said summing amplifier for outputting sum of the inverted input signal and mute signal;
   a switch for connecting the output of the summing amplifier to the ground voltage; and
   a mute signal generating circuit capable of stepping down the output of said summing amplifier to the ground voltage; wherein
   the mute signal generating circuit generates a predetermined voltage for canceling the offset voltage generated by the summing amplifier.

2. The mute circuit according to claim 1, wherein the summing amplifier comprises a first operational amplifier having an inverting input terminal, a non-inverting input terminal, and an output terminal; a first resistor connected to the inverting input terminal of the first operational amplifier to supply the analog input signal; a second resistor connected to the inverting input terminal of the first operational amplifier to supply the mute signal; and a feedback resistor connected between the inverting input terminal and the output terminal of the first operational amplifier, the non-inverting input terminal of the first operational amplifier being supplied the analog common voltage.

3. The mute circuit according to claim 2, wherein
   a capacitive element is connected between a terminal for inputting the analog signal and the first resistor.

4. The mute circuit according to claim 1, wherein the mute signal generating circuit further comprises:
   a selecting circuit for selecting either of the analog common voltage and the ground voltage, said selected voltage being supplied to said mute signal generating circuit;
   a comparing circuit for comparing the level of the mute signal generated by the mute signal generating circuit with a reference level; and
   a control circuit for controlling said selecting circuit based on the output of the comparing circuit.

5. The mute circuit according to claim 2 or 4, wherein
   the mute signal generating circuit comprises; a second operational amplifier having an inverting input terminal, a non-inverting input terminal, and an output terminal; a third resistor connected to the inverting input terminal of the second operational amplifier to supply the analog common voltage or the ground voltage selected by the selecting circuit; and a feedback resistor connected between the inverting input terminal and the output terminal of the second operational amplifier, the non-inverting input terminal of the second operational amplifier being supplied the analog common voltage; and
   the mute signal generating circuit generates a mute signal for canceling the offset voltage of the first operational amplifier.

6. The mute circuit according to claim 4, wherein
   the selecting circuit comprises a first switch for connecting the output terminal of the selecting circuit to an analog common voltage via a first resistor a second switch for connecting the output terminal of the selecting circuit to the ground voltage via a second resistor, and a capacitor connected to the output terminal of the selecting circuit; and outputs of the output terminal are varied with the time constant of the first and second resistors and capacitors.

* * * * *